(12) United States Patent
Shimotsusa

(10) Patent No.: US 9,196,643 B2
(45) Date of Patent: Nov. 24, 2015

(54) SOLID-STATE IMAGING DEVICE HAVING PHOTOELECTRIC CONVERSION UNITS ON A FIRST SUBSTRATE AND A PLURALITY OF CIRCUITS ON A SECOND SUBSTRATE

(75) Inventor: Mineo Shimotsusa, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 256 days.

(21) Appl. No.: 13/806,999

(22) PCT Filed: Jun. 23, 2011

(86) PCT No.: PCT/JP2011/003594
§ 371 (c)(1),
(2), (4) Date: Dec. 26, 2012

(87) PCT Pub. No.: WO2012/001923
PCT Pub. Date: Jan. 5, 2012

(65) Prior Publication Data
US 2013/0112854 A1    May 9, 2013

(30) Foreign Application Priority Data

Jun. 30, 2010   (JP) .................................. 2010-149477

(51) Int. Cl.
*H01L 27/00*   (2006.01)
*H01L 27/146*   (2006.01)
*H04N 5/374*   (2011.01)

(52) U.S. Cl.
CPC .......... *H01L 27/146* (2013.01); *H01L 27/1464* (2013.01); *H01L 27/14609* (2013.01); *H01L 27/14634* (2013.01); *H01L 27/14636* (2013.01); *H04N 5/3741* (2013.01)

(58) Field of Classification Search
CPC .................................................. H01L 27/14634
USPC ........................................................ 250/208.1
See application file for complete search history.

(56) References Cited

U.S. PATENT DOCUMENTS

| 8,792,034 | B2* | 7/2014 | Takahashi | 348/305 |
| 2003/0146517 | A1* | 8/2003 | Lasky et al. | 257/777 |
| 2007/0236590 | A1* | 10/2007 | Harris | 348/308 |
| 2009/0124047 | A1* | 5/2009 | Adkisson et al. | 438/109 |
| 2010/0020217 | A1 | 1/2010 | Abe | |
| 2010/0045837 | A1 | 2/2010 | Yamashita | |
| 2010/0238334 | A1* | 9/2010 | Takahashi | 348/305 |
| 2010/0276572 | A1* | 11/2010 | Iwabuchi et al. | 250/208.1 |

FOREIGN PATENT DOCUMENTS

| CN | 1822379 A | 8/2006 |
| CN | 101151730 A | 3/2008 |

(Continued)

*Primary Examiner* — Thanh Luu
(74) *Attorney, Agent, or Firm* — Canon USA, Inc. IP Division

(57) ABSTRACT

The present invention provides a solid-state imaging device including a first substrate provided with a plurality of photoelectric conversion units thereon, and a second substrate provided with a reading circuit and parallel processing circuits thereon. The solid-state imaging device includes a DC voltage supply wiring configured to supply a DC voltage to the plurality of parallel processing circuits. The DC voltage supply wiring is formed by electrically connecting first conductive patterns provided on the first substrate with second conductive patterns provided on the second substrate.

20 Claims, 8 Drawing Sheets

(56) References Cited

FOREIGN PATENT DOCUMENTS

| | | |
|---|---|---|
| CN | 100515050 C | 7/2009 |
| CN | 101523602 A | 9/2009 |
| CN | 101656820 A | 2/2010 |
| JP | 2006-191081 A | 7/2006 |
| JP | 2008-536330 A | 9/2008 |
| JP | 2009-170448 A | 7/2009 |
| JP | 2010-506404 A | 2/2010 |
| TW | 200803484 A | 1/2008 |
| WO | 2007/105478 A | 9/2007 |
| WO | 2007/148891 A | 12/2007 |

* cited by examiner

SOLID-STATE IMAGING DEVICE HAVING PHOTOELECTRIC CONVERSION UNITS ON A FIRST SUBSTRATE AND A PLURALITY OF CIRCUITS ON A SECOND SUBSTRATE

TECHNICAL FIELD

The present invention relates to a solid-state imaging device formed by making electrical connections between a first substrate provided with photoelectric conversion units thereon and a second substrate provided with peripheral circuits thereon.

BACKGROUND ART

With a solid-state imaging device having a known architecture, photoelectric conversion units and peripheral circuits are separately formed on different substrates which are electrically connected with each other by using a micro bump.

Japanese Patent Application Laid-Open No. 2009-170448 discusses a backside illumination solid-state imaging device including a first substrate and a second substrate stuck together. The first substrate includes pixels, photoelectric conversion units, and a reading circuit for reading signals. The second substrate includes peripheral circuits for processing signals read out from pixels.

Generally, to read signals from a solid-state imaging device at high speed, the solid-state imaging device includes a plurality of parallel processing circuits for parallelly applying similar signal processing to signals from the plurality of pixels. Exemplary parallel processing circuits include a column amplifier and a row AD unit provided for each pixel column.

A direct current (DC) voltage is supplied to such a plurality of parallel processing circuits performing similar processing, to enable them to perform a desired operation. As the DC voltage, a desired voltage is supplied via a common DC voltage supply wire to the parallel processing circuits performing similar processing. The parallel processing circuits are provided on the second substrate. It is desirable not to provide other circuits on the first substrate to provide an as large opening of the photoelectric conversion units as possible. Therefore, a number of circuit elements must be provided in an area for providing the parallel processing circuits on the second substrate, possibly reducing the degree of freedom of wiring layout. To increase the degree of freedom of wiring layout, it is necessary to provide a large area for providing the parallel processing circuits, resulting in an increase in chip area.

Therefore, allocating a large area for the above-mentioned DC voltage supply wiring is difficult, and may produce a predetermined resistance in the DC voltage supply wiring. There arises a problem that an alias is likely to occur when a resistance is produced in a wiring for supplying a DC voltage to the parallel processing circuits. In particular, the larger the chip area, the more an alias is likely to occur.

CITATION LIST

Patent Literature

PTL 1: Japanese Patent Application Laid-Open No. 2009-170448

SUMMARY OF INVENTION

The present invention is directed to providing a solid-state imaging device capable of preventing the occurrence of an alias without increasing a chip area.

According to an aspect of the present invention, a solid-state imaging device includes: a plurality of pixels each having a photoelectric conversion unit and a reading circuit configured to process or read a signal generated by the photoelectric conversion unit; and a plurality of parallel processing circuits configured to parallelly process signals from a predetermined number of pixels out of the plurality of pixels, wherein the plurality of photoelectric conversion units is provided on a first substrate, the reading circuit and the parallel processing circuits are provided on a second substrate, and the photoelectric conversion units and the reading circuit are electrically connected with each other so that the reading circuit receives signals from the photoelectric conversion units, wherein the solid-state imaging device further comprises a DC voltage supply wiring configured to supply a DC voltage to the plurality of parallel processing circuits, and wherein the DC voltage supply wiring is formed by electrically connecting first conductive patterns provided on the first substrate with second conductive patterns provided on the second substrate.

Advantageous Effect of Invention

The present invention enables providing a solid-state imaging device capable of preventing the occurrence of an alias without increasing the chip area.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Various exemplary embodiments, features, and aspects of the invention will be described in detail below with reference to the drawings.

Figure 1:
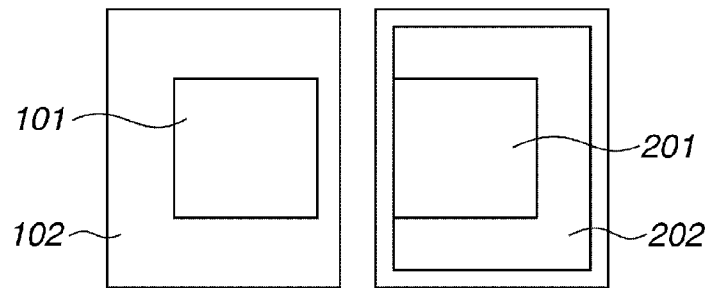
FIG. 1 is a top view schematically illustrating a solid-state imaging device according to the present invention.

FIG. 1 is a top view schematically illustrating a first substrate and a second substrate forming a solid-state imaging device according to the present invention. Referring to FIG. 1, the first substrate (left) includes a plurality of photoelectric conversion units, and the second substrate (right) includes reading circuit and parallel processing circuits. The reading circuit processes signals generated by the photoelectric conversion units or outputs the signals to common output lines. The parallel processing circuits parallelly process signals from a predetermined number of pixels out of a plurality of pixels.

A first pixel area 101 includes a plurality of photoelectric conversion units, for example, in 2-dimensional matrix form. The first pixel area 101 may also include transfer transistors forming a transfer unit and a floating diffusion (FD) to which electric charges are transferred from the photoelectric conversion units through the transfer transistors.

A first peripheral area 102 does not include photoelectric conversion units. When circuit elements are not provided or when transfer transistors are provided, the first peripheral area 102 may include a scanning circuit for controlling operation of the transfer transistors. Shift registers and decoders can be used as the scanning circuit.

A second pixel area 201 includes circuits for processing signals generated by the photoelectric conversion units in the first pixel area 101 for each pixel and then outputting the signals to the common output lines. The second pixel area 201 may include, for example, pixel amplifiers for amplifying signals generated by the photo-electric conversion units for each pixel, pixel reset units for resetting the potential of input nodes of the pixel amplifiers, and selection units for selecting desired pixels and outputting signals to the common output lines. The second pixel area 201 may also include A/D conversion units.

A second peripheral area 202 includes circuits for processing signals from pixels after they are read out to the common output lines. The second peripheral area 202 includes, for example, amplifiers, signal holding units, and A/D conversion circuits. The second peripheral area 202 also includes a scanning circuit for driving the above-mentioned reset units and selection units. Shift registers and decoders can be used as the scanning circuit.

The present invention is characterized in that the DC power supply wiring for circuits provided in the second peripheral area 202 is formed by electrically connecting first conductive patterns provided on the first substrate with respective second conductive patterns provided on the second substrate. This circuit architecture enables decreasing the resistance of the DC power supply wiring to reduce voltage drop. An exemplary DC power supply wiring suitable for applying the circuit architecture according to the present invention will be described below. The DC voltage supply wiring refers to a wiring for supplying a DC voltage almost without voltage fluctuation, which can be turned ON or OFF through switch operation for the purpose of reducing the power consumption. In other words, the direction of the DC voltage remains temporally unchanged.

Generally with a solid-state imaging device, signals from a plurality of pixels are read by respective output nodes at the same time. Examples of such nodes are a plurality of common output lines. The common output lines are provided with respective parallel processing circuits performing similar processing, and the DC voltage supply wiring is commonly used by the parallel processing circuits.

With this circuit architecture, signals currently being processed by other parallel processing circuits is affected via the common DC voltage supply wiring, resulting in a phenomenon similar to what is called smear seen in charge-coupled devices (CCDs).

A first exemplary common wiring is a wiring for supplying a DC voltage to a current source circuit for supplying a bias current to the pixel amplifiers. As an exemplary current source circuit, a current mirror using load metal-oxide semiconductor (MOS) transistors can be used. Generally, a ground potential is supplied to the source of a load MOS transistor. With this current mirror, the DC voltage supply wiring supplies a ground potential. A ground wiring for supplying the ground potential is commonly connected to the source of the load MOS transistor provided on the plurality of common output lines.

With this circuit architecture, when strong light is incident on a portion of an imaging plane, the current flowing in the ground wiring changes, which changes the influence of voltage drop in the ground wiring. This changes the current flowing in current source circuits of adjacent pixel columns, possibly producing an alias, i.e., a signal showing a level shift of a pixel to which a bias current is supplied by other current source circuits. An alias is produced when the ground wiring has a fixed resistance, and is more likely to occur when the ground wiring has a higher resistance. An alias is more likely to occur with a larger imaging plane size. In particular, an imaging plane size equal to or larger than APS-C largely affects the occurrence of an alias. This phenomenon is likely to occur also when the pixel number is increased because of an increase in the amount of current necessary to perform a single operation.

A second exemplary common wiring is a wiring for supplying a DC voltage to the column amplifier provided for each of the common output lines or for each of a plurality thereof. An exemplary column amplifier circuit is an operational amplifier circuit. A current source circuit is provided to supply a tail current (bias current) to the operational amplifier circuit. Similar to the first exemplary common wiring, a current mirror can be used as a current source circuit. A wiring for supplying a DC voltage to the current source circuit is commonly connected to a plurality of column amplifiers. With this circuit architecture, when strong light is incident on a portion of the imaging plane, an optical signal having an excessive signal level is output from some pixels to the common output lines. In this case, when the operational amplifier circuit amplifies the optical signal, a current source circuit included in a differential amplifier may send an excessive current to the ground wiring. Thus, column amplifiers of other pixel columns cannot output appropriate signals because of the influence of the excessive current. Therefore, an alias occurs in an image obtained according to image signals output from the solid-state imaging device.

A third exemplary common wiring is a wiring for supplying a voltage to the signal holding units for parallelly retaining signals parallelly read out to a plurality of common output lines. Generally, the capacitance for retaining a signal includes a signal node which receives a signal from a column amplifier, and a fixed node to which a pre-determined voltage is supplied by the DC voltage supply wiring. The predetermined voltage is the power voltage, the ground potential, or an intermediate potential therebetween. With this circuit architecture, when strong light is incident on a portion of the imaging plane, a large signal is input to the signal holding units corresponding to pixel columns on which the strong light is incident. This largely changes the potential of the signal node, and the potential of the fixed node changes along with changing potential of the signal node. Then, a large current temporarily flows in the DC voltage supply wiring and accordingly the potential of the DC voltage supply wiring changes. This change in potential of the DC voltage supply wiring is propagated to fixed node of signal holding units of other pixel columns. In this state, outputting a signal to subsequent circuits before the change in potential subsides produces an alias.

A circuit for parallelly processing signals from the pixels as above-mentioned will be hereinafter referred to as parallel processing circuit.

Figure 10A:
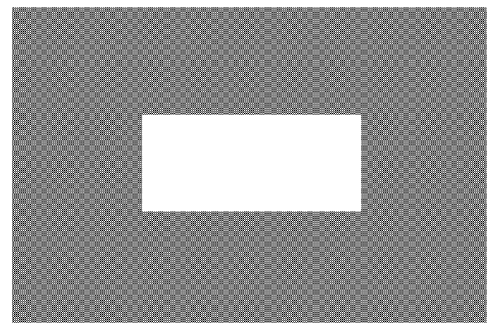
FIG. 10A schematically illustrates a state where an alias occurs.
Figure 10B:
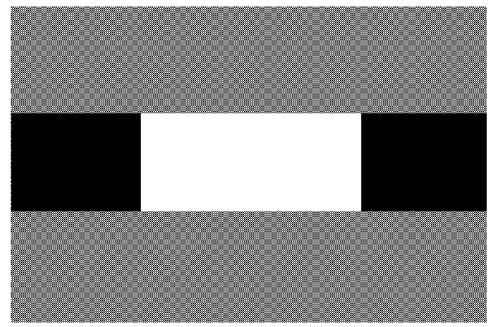
FIG. 10B schematically illustrates a state where an alias occurs.
Figure 10C:
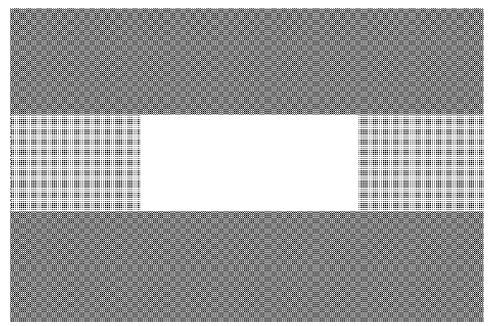
FIG. 10C schematically illustrates a state where an alias occurs.

FIG. 10C schematically illustrates a state where an alias occurs. FIG. 10A illustrates an ideal state where no alias is produced. FIGS. 10B and 10C illustrate a state where an alias is produced. FIGS. 10A to 10C illustrate a state where strong light is incident on a portion of the imaging plane, specifically, a central screen portion. FIG. 10B illustrates a state where strong light is incident on a portion of the imaging plane, i.e., around a central screen portion, and other screen portions are dark. FIG. 10B demonstrates that areas on both sides of the portion of the imaging plane receiving strong incident light are darker and duller than the signals to be regularly output.

FIG. 10C illustrates a state that, although the portion receiving strong incident light is similar to that in FIG. 10B, both sides of that portion are bright in an opposite way to the state illustrated in FIG. 10B.

The difference between the states in FIGS. 10B and 10C is caused by the difference in circuit architecture. For example, the DC voltage supply wiring for supplying a DC voltage to the pixel current source described in the first example may produce an image as illustrated in FIG. 10C. Further, the DC voltage supply wiring for supplying a DC voltage to the signal holding unit may produce an image as illustrated in FIG. 10B.

The above-mentioned problem may arise if the circuit architecture includes any one of the above-mentioned parallel processing circuits, not necessarily all of them. Effects of the present invention can be acquired by providing conductive patterns corresponding to the DC voltage supply wiring on the first substrate and then making respective electrical connections. The above-mentioned problem is not limited to the one caused by the above-mentioned circuit architecture but may be the one caused by providing a common DC voltage supply wiring for the plurality of parallel processing circuits for performing parallel processing of signals from a predetermined number of pixels out of a plurality of pixels.

With the above-mentioned circuit architecture having all of the parallel processing circuits, effects of the present invention can be acquired by providing the first conductive patterns (on the first substrate) with respect to the DC voltage supply wiring for any one of parallel processing circuits, not necessarily for all of them. However, higher effects can be acquired by providing the first conductive patterns with respect to the DC voltage supply wiring for all of parallel processing circuits.

Figure 2A:
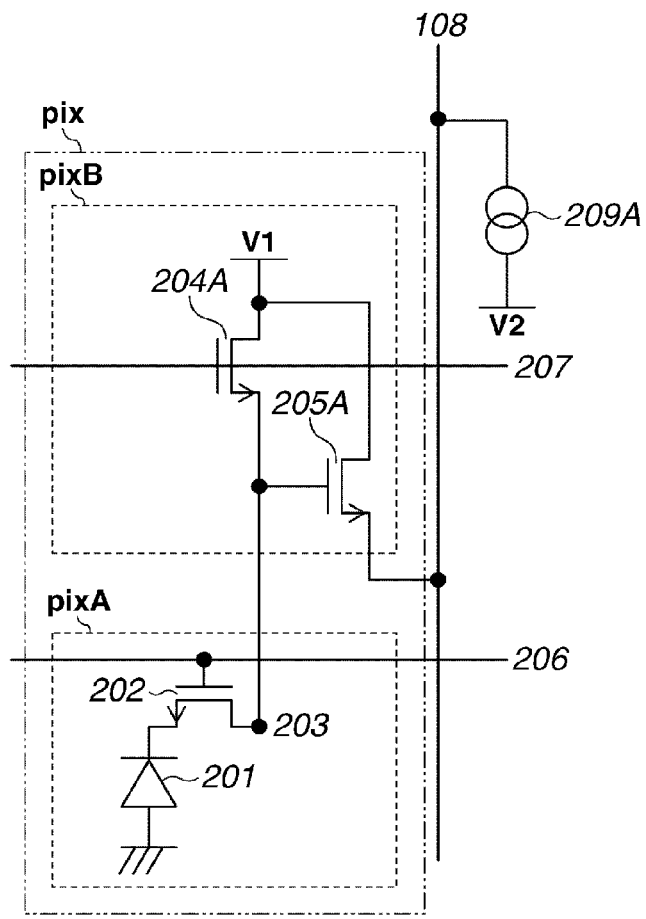
FIG. 2A is an exemplary circuit diagram of one pixel of the solid-state imaging device according to the present invention.
Figure 2B:
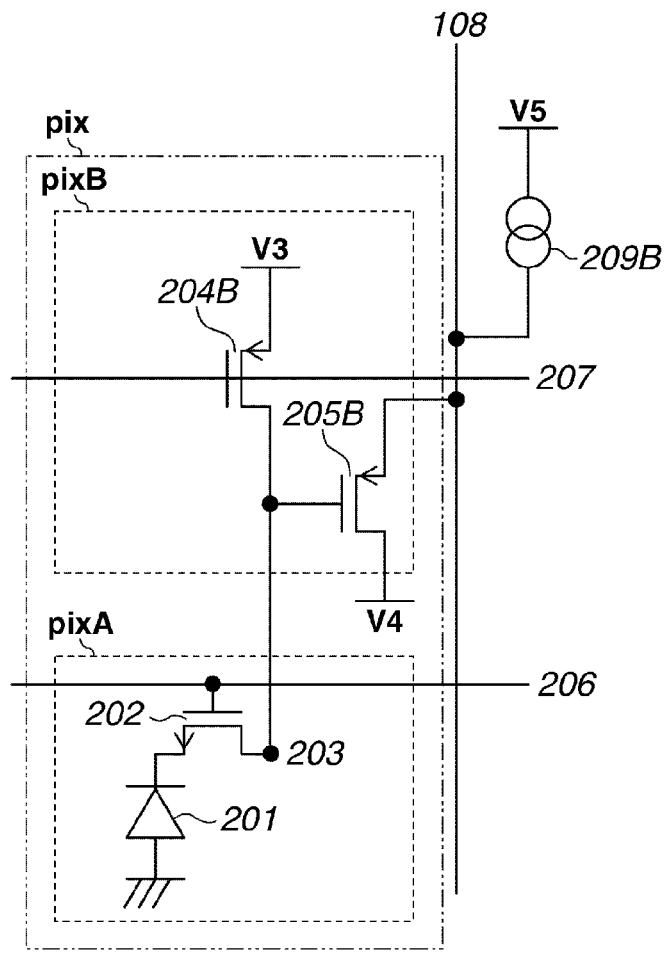
FIG. 2B is an exemplary circuit diagram of one pixel of the solid-state imaging device according to the present invention.

FIGS. 2A and 2B illustrate equivalent circuit diagrams of pixels of the solid-state imaging device according to the present invention. Although FIGS. 2A and 2B respectively illustrate only one pixel, a pixel array is actually formed of a plurality of pixels.

A photoelectric conversion unit 201 produces holes and electrons through photo-electric conversion. For example, a photodiode is used as the photoelectric conversion unit 201.

A transfer unit 202 transfers electric charges of the photoelectric conversion unit 201. For example, a MOS transistor is used as the transfer unit 202 (this MOS transistor is referred to as transfer transistor).

A floating node 203 reads out a signal. When electric charges of the photoelectric conversion unit 201 are transferred by the transfer unit 202, the potential is floated. The floating node 203 includes, for example, a floating diffusion (FD) which is provided on the first substrate.

A pixel reset unit 204 sets the potential of the floating node 203 at least to a reference potential. Alternatively, setting the pixel reset unit 204 to ON at the same time as the transfer unit 202 sets the potential of the photoelectric conversion unit 201 to the reference potential. For example, a MOS transistor is used as the pixel reset unit 204 (this MOS transistor is referred to as reset transistor).

A pixel amplifier 205 amplifies a signal based on one electric charge of a charge pair generated by the photoelectric conversion unit 201. For example, a MOS transistor is used as the pixel amplifier 205. In this case, the gate of the MOS transistor of the pixel amplifier 205 is electrically connected with the FD (this MOS transistor is referred to as amplifier transistor).

A transmission control line 206 is provided on the first substrate to control the operation of the transfer unit 202. A reset control line 207 is provided on the second substrate to control the operation of the pixel reset unit 204. When the transfer unit 202 and the pixel reset unit 204 are MOS transistors, the transmission control line 206 and the reset control line 207 transmit to the gate of each MOS transistor a pulse for turning it ON and OFF.

A common output line 208 outputs a signal amplified by the pixel amplifier 205. Signals from a plurality of pixels included in the pixel array are read out to the common output line 208. A set of pixels read out to one common output line 208 can also be referred to as pixel column.

A current source 209 supplies a bias current to the pixel amplifier 205. With the present circuit architecture, the current source 209 supplies a bias current for enabling source follower operation of the amplifier transistor 205.

Referring to FIG. 2A, a voltage V1 is supplied to the drains of an amplifier transistor 205A and a reset transistor 204A. Although the voltage V1 is commonly used, different power voltages can also be used. Referring to FIG. 2A, a voltage V2 is supplied to a current source 209A.

Referring to FIG. 2B, a voltage V3 is supplied to the drain of a reset transistor 204B. Referring to FIG. 2B, a voltage V4 is supplied to the drain of an amplifier transistor 205B. Referring to FIG. 2B, a voltage V5 is supplied to a current source 209B.

Of elements forming a pixel, pix A denotes a portion provided on the first substrate and pix B denotes a portion provided on the second substrate. A pixel pix is formed by pix A and pix B. Arranging a control line on either one substrate refers to providing the control line more on the side of the one substrate than direct electrical connection units between the first and second substrates.

Differences between circuit diagrams in FIGS. 2A and 2B will be described below. To distinguish different members, subscripts a and b are assigned thereto. For example, the circuit diagrams in FIGS. 2A and 2B are different in conductivity type of the amplifier transistors 205 and the reset transistors 204. Specifically, NMOS transistors are used in FIG. 2A and PMOS transistors are used in FIG. 2B. Accordingly, voltages supplied to respective transistors and current sources are different between the two circuit diagrams.

Referring to FIG. 2A, the voltage V1 is, for example, a 5V or 3.3V DC voltage. The voltage V2 is lower than the voltage V1, such as a ground potential. Referring to FIG. 2B, the voltages V3 and V4 are relatively low potentials such as the ground potential. The voltage V5 is higher than the voltage V3, such as 3.3V and 1.8V.

Referring to FIG. 2B, the amplifier transistor 205B is a PMOS transistor. The photo-electric conversion unit 201 uses electrons as signal charges. With a large amount of incident light, the gate potential of the PMOS transistor decreases and accordingly the source potential of the PMOS transistor increases in comparison to a case of dark incident light. Specifically, when the signal amplitude is large in comparison to a case of reset operation, the common output line 208 can be driven in a state where the driving force is high.

Therefore, the circuit architecture in FIG. 2B is more advantageous in reading speed than that in FIG. 2A. In the conventional circuit architecture, since the above-mentioned two circuits were provided on the same single substrate, a well is divided within a pixel, resulting in a complicated structure. Alternatively, miniaturization of pixels was difficult and therefore the photoelectric conversion unit had a low opening rate. On the other hand, with the present invention, the photoelectric conversion units, pixel amplifiers, and pixel reset units are separately formed on different substrates, thus preventing the above-mentioned harmful effects. Further, the circuit in FIG. 2B has a narrower operating voltage range and therefore is more advantageous in power voltage reduction than that in FIG. 2A.

The essential point of the circuit in FIG. 2B is not that a PMOS transistor is used as the amplifier transistor 205B but that a MOS transistor having the reverse polarity to signal charges is used as the amplifier transistor 205B. Specifically, PMOS transistors are used as the amplifier transistor 205B and the reset transistor 204B when electrons serve as signal charges, and NMOS transistors are used as the transistors 205B and 204B when holes serve as signal charges. Referring to the conductivity type of the transfer transistor 202, the transfer transistor 202 is a first conductivity type transistor, and the amplifier transistor 205B and the reset transistor 204B are second conductivity type transistors which are of the reverse conductivity type to the first conductivity type.

Although the pixel architecture has specifically been described, the pixel architecture is not limited thereto. For example, a junction field effect transistor (JFET) can also be used as the amplifier transistor. The photoelectric conversion unit 201 may use holes as signal charges. In this case, a PMOS transistor is preferably used as the transfer transistor 202. Further, the amplifier transistor and reset transistor may be shared by a plurality of photoelectric conversion units, and the selection transistor may be formed in series with the amplifier transistor. Further, assignment of the pixel architecture to a plurality of substrates is not limited to the above-mentioned circuit architecture. The reset MOS transistor and the amplifier MOS transistor may be provided on the first substrate. However, the common output lines need to be provided on the second substrate. Further, without providing a pixel with the amplifier transistor and reset transistor, electric charges of the photoelectric conversion unit may be directly output to the common output line by the transfer transistor.

Figure 3:
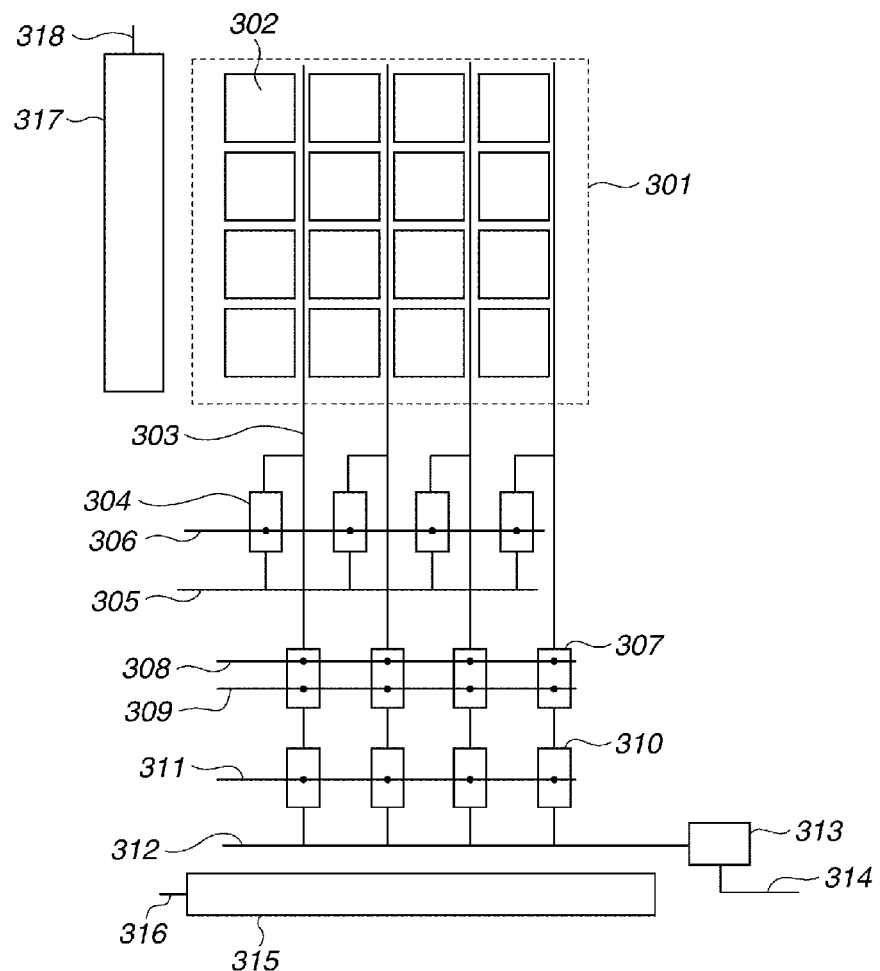
FIG. 3 is a block diagram illustrating an overall configuration of the solid-state imaging device according to the present invention.

FIG. 3 is a block diagram illustrating the solid-state imaging device according to the present invention. Referring to FIG. 3, only circuit elements provided on the second substrate will be mainly described. Further, the conductivity type of transistors forming a pixel will be described below based on a case illustrated in FIG. 2A.

A pixel area 301 corresponds to the second pixel area 103 in FIG. 1.

A portion 302 is a portion provided on the second substrate, out of elements forming a pixel. The portion 302 corresponds to pix B in FIGS. 2A and 2B.

A common output line 303 is provided for each pixel column. Pixels are provided in 2-dimensional matrix form. Signals of each row are parallelly read out to each common output line.

A current source circuit 304 may function as one of parallel processing circuits. The current source circuit 304 supplies a bias current for the amplification operation of the pixel amplifier. The current source circuit 304 corresponds to the current source 209A in FIG. 2A.

A first DC voltage supply wiring 305 supplies a DC voltage to the current source circuit 304. The first DC voltage supply wiring 305 corresponds to the voltage V2 in FIG. 2A.

A second DC voltage supply wiring 306 is provided as required to supply a bias current to the current source circuit 304. For example, the second DC voltage supply wiring 306 supplies a predetermined voltage to the gate of a common gate amplifier MOS transistor when a cascode current source is used.

A column amplifier 307 is provided for each of pixel columns or for each of a plurality thereof. The column amplifier 307 may function as one of parallel processing circuits. Further, the column amplifier 307 may be provided with a circuit for preventing noise of a pixel portion. The column amplifier 307 can be specifically formed by using a source follower, common source, and operational amplifier circuits.

A third DC voltage supply wiring 308 supplies a ground potential to the column amplifier 307.

A fourth DC voltage supply wiring 309 is provided as required to supply a bias current to the column amplifier 307. For example, the fourth DC voltage supply wiring 309 supplies a predetermined voltage to the gate of a common gate amplifier MOS transistor when a cascode current source is used.

A signal holding unit 310 may function as one of parallel signal processing circuits. The signal holding unit 310 may include a retaining unit for retaining only an optical signal, or include a retaining unit for retaining both a noise signal and an optical signal having the noise signal superimposed thereon.

A fifth DC voltage supply wiring 311 supplies a ground potential to the signal holding unit 310.

A second common output line 312 sequentially selects a signal after being retained by the signal holding unit 310 and then transmits the signal to the subsequent circuit.

An output amplifier 313 amplifies or buffers the signals transmitted from the second common output line 312 and then outputs them to the external via an output pad (not illustrated). Although only one output amplifier 313 is illustrated, a plurality of output amplifiers 313 may be provided to enable parallel processing.

A supply wiring 314 supplies a predetermined voltage to the output amplifier 313. The supply wiring 314 supplies the power voltage, ground potential, or an intermediate voltage therebetween.

A first scanning unit 315 sequentially selects a signal retained by the signal holding units 310 and then outputs it to the second common output line 312.

A supply wiring 316 supplies a predetermined voltage to the first scanning unit 315. The supply wiring 314 supplies the power voltage, ground potential, or an intermediate voltage therebetween.

A second scanning unit 317 controls the drive of the pixel reset unit provided on the second substrate out of pixels.

A supply wiring 318 supplies a predetermined voltage to the second scanning unit 317. The supply wiring 318 supplies the power voltage, ground potential, or an intermediate voltage therebetween.

Figure 4:
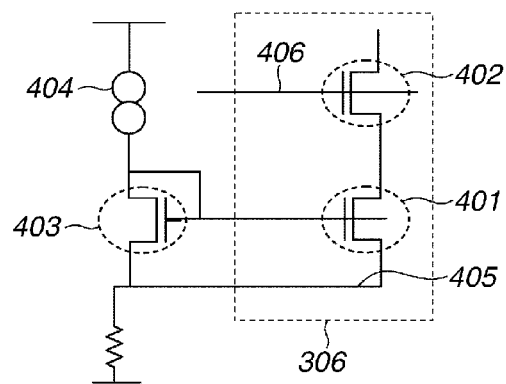
FIG. 4 illustrates an exemplary equivalent circuit diagram of a current source.

FIG. 4 illustrates an exemplary equivalent circuit diagram of a current source circuit serving as the parallel processing circuit in FIG. 3. Referring to FIG. 4, a portion enclosed by a dotted-line square corresponds to the second DC voltage supply wiring 306 in FIG. 3. This portion corresponding to the second DC voltage supply wiring 306 is provided for the number of rows.

A transistor 401 is a load MOS transistor. A MOS transistor 402 operates as a common gate amplifier circuit. A predetermined voltage is supplied to the gate of the MOS transistor 402. The gate of a MOS transistor 403 is connected with the gate of the load MOS transistor 401. A current source 404 sends a fixed current to the MOS transistor 403. A ground wiring 405 corresponds to the first DC voltage supply wiring 305 in FIG. 3. A ground wiring 405 is commonly connected to the sources of the transistors 401 and 403. A bias supply wiring 406 supplies a predetermined voltage to the gate of the MOS transistor 402. The bias supply wiring 406 corresponds to the second DC voltage supply wiring 306 in FIG. 3. The circuit in FIG. 4 constitutes a cascode current source circuit.

With the circuit architecture in FIG. 4, when strong light is incident on a portion of the imaging plane and the potential of the common output lines for some pixel columns largely drops, the current flowing in the ground wiring 405 decreases. Accordingly, currents flowing in the load MOS transistors for other pixel columns increase to cause signals' level to shift toward brighter levels, resulting in an alias output. The resultant image is as illustrated in FIG. 10C.

This phenomenon occurs since a certain resistance is produced in the ground wiring 405. Therefore, to reduce this resistance, the ground wiring 405 is formed by providing the first conductive patterns on the first substrate and then electrically connecting them with respective second conductive patterns provided on the second substrate. This circuit architecture can prevent the occurrence of an alias.

Although the circuit architecture in FIG. 4 has specifically been described based on a cascode current source circuit, it is also applicable to an ordinary current mirror circuit. With a simple current mirror, the current source circuit has a small output resistance and therefore higher effects can be obtained by applying the present invention.

Figure 5:
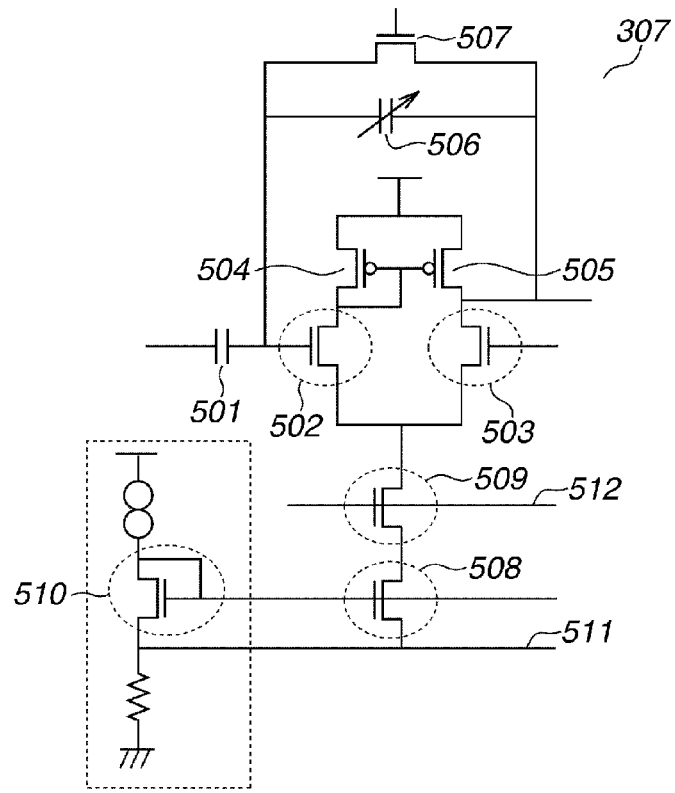
FIG. 5 illustrates an exemplary equivalent circuit diagram of a column amplifier.

FIG. 5 illustrates an exemplary equivalent circuit diagram of the column amplifier in FIG. 3. An operational amplifier circuit is illustrated as an example.

One node of a holding capacitance 501 is connected to the common output line 303. Transistors 502 and 503 are NMOS transistors, and transistors 504 and 505 are PMOS transistors. A feedback capacitance 506 is provided between the input and output nodes of the operational amplifier circuit. The use of a variable capacitance as the feedback capacitance 506 can change the gain of the operational amplifier circuit.

A switch 507 is provided in parallel with the feedback capacitance 506. The switch 507 is provided to cause the operational amplifier circuit to perform voltage follower operation. The switch 507 supplies to the other node of the holding capacitance 501 the voltage supplied to the gate of the NMOS transistors 503. NMOS transistors 508, 509, and 510 form a cascode constant current source circuit in similar way to the circuit in FIG. 4. This cascode current source circuit supplies the tail current of the operational amplifier circuit.

A ground wiring 511 corresponds to the third DC voltage supply wiring 308 in FIG. 3. A bias supply wiring 512 supplies a predetermined bias current to the gate of the NMOS transistor 509. The bias supply wiring 512 corresponds to the fourth DC voltage supply wiring 309 in FIG. 3.

With the circuit architecture in FIG. 5, when strong light is incident on a portion of the imaging plane, a signal having an excessive level is input to the gate of an input transistor 502. As the potential of the source of the input transistor 502 rises, the potential of the drain of the NMOS transistor 508 also rises. As a result, the current source circuit may send an excessive current to the ground wiring 511. Accordingly, bias currents supplied by the current source circuits of the column amplifiers for other pixels decrease to cause signals' level to shift toward darker levels, resulting in an alias output. The resultant image is as illustrated in FIG. 10B.

This phenomenon occurs since a certain resistance is produced in the ground wiring 511. Therefore, to reduce this resistance, the ground wiring 511 is formed by providing the first conductive patterns on the first substrate and then electrically connecting them with respective second conductive patterns provided on the second substrate. This circuit architecture can prevent the occurrence of an alias.

Although the circuit architecture in FIG. 5 has specifically been described based on a cascode current source circuit as a circuit for supplying the tail current of the operational amplifier circuit, it is also applicable to an ordinary current mirror circuit. With a simple current mirror, the current source circuit has a small output resistance and therefore higher effects can be obtained by applying the present invention.

Figure 6:
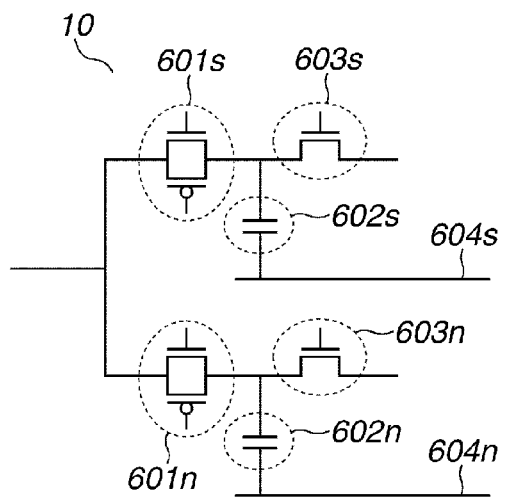
FIG. 6 illustrates an exemplary equivalent circuit diagram of a signal holding unit.

FIG. 6 illustrates an exemplary equivalent circuit diagram of the signal holding unit 310 in FIG. 3. The signal holding unit 310 can retain both a noise signal and an optical signal having the noise signal superimposed thereon. The noise signal mainly includes an offset of the column amplifier. The signal holding unit 310 may retain only the optical signal.

A CMOS switch 601s transfers to the subsequent capacitance the optical signal having the noise signal superimposed thereon. A CMOS switch 601n transfers the noise signal to the subsequent capacitance. An optical signal holding capacitance 602s retains the optical signal having the noise signal superimposed thereon. A noise signal holding capacitance 602n retains the noise signal. A switch 603s outputs the optical signal having the noise signal superimposed thereon to the subsequent second common output line 312 and the output amplifier 313. A switch 603n outputs the noise signal to the subsequent second common output line 312 and the output amplifier 313. A ground wiring 604s supplies a ground potential to the fixed node of the capacitance 602s disposed on the opposite side of the signal node thereof to which the signal is supplied. A ground wiring 604n supplies a ground potential to the fixed node of the capacitance 602n disposed on the opposite side of the signal node thereof to which the signal is supplied. The ground wiring 604s and 604n correspond to the fourth DC voltage supply wiring 311.

With the circuit architecture in FIG. 6, when strong light is incident on a portion of the imaging plane, a signal having an excessive level is supplied to the signal node of the capacitance 602s. Accordingly, the potential of the fixed node of the capacitance 602s largely changes, and a large transient current flows in the ground wiring 604s. Accordingly, signals retained by the signal holding units for other pixel columns are affected to cause signals' level to shift toward brighter levels, resulting in an alias output. The resultant image is as illustrated in FIG. 10C.

This phenomenon occurs since a certain resistance is produced in the ground wiring 604s. Therefore, to reduce this resistance, the ground wiring 604s is formed by providing the first conductive patterns on the first substrate and then electrically connecting them with respective second conductive patterns provided on the second substrate. This circuit architecture can prevent the occurrence of an alias.

Figure 7:
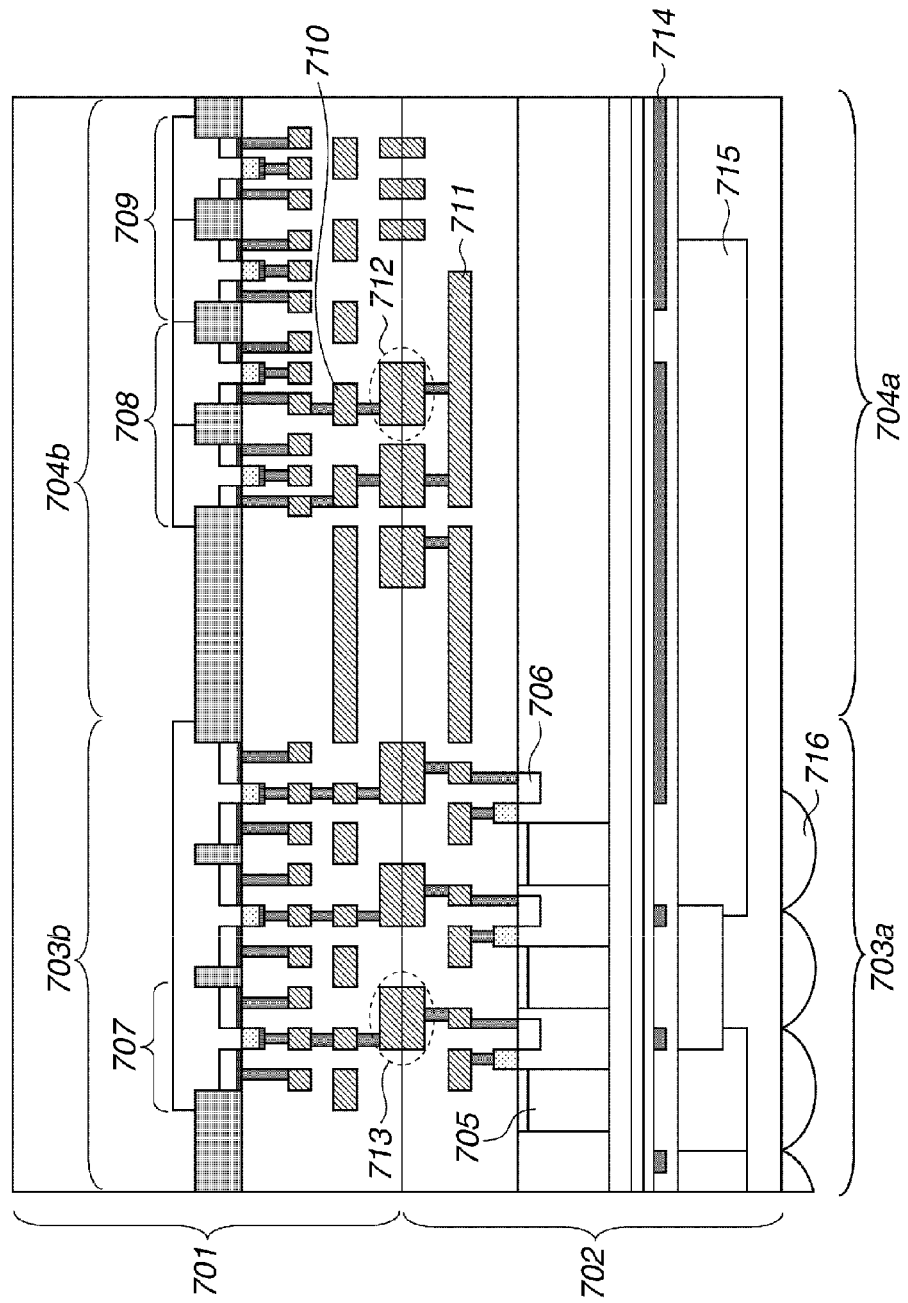
FIG. 7 schematically illustrates electrical connections between a first substrate and a second substrate.

FIG. 7 schematically illustrates a cross section including electrical connection units between the first and second substrates. FIG. 7 illustrates a portion of a DC power supply circuit pattern for supplying a DC power supply to the parallel processing circuits schematically illustrated in the block diagram in FIG. 3 or to any one of the parallel processing circuits illustrated in FIGS. 4 to 6.

A pixel area 703a is provided on a first substrate 701. A pixel area 703b is provided on a second substrate 702. A first peripheral area 704a is provided on the first substrate 701. A second peripheral area 704b is provided on the second substrate 702. The first peripheral area 704a is provided on a portion other than the pixel area 703a, and the second peripheral area 704b is provided on a portion other than the pixel area 703b. The second peripheral area 704b includes a circuit for processing a signal output from the pixel area 703b via the common output line or controlling the signal output from the pixel area 703b.

Electric charges of a photoelectric conversion unit 705 are transferred to a FD 706. The photoelectric conversion unit 705 and the FD 706 form a transfer transistor. An amplifier transistor 707 forms an amplifier. The gate of the amplifier transistor 707 is electrically connected with the FD 706. A MOS transistor 708 forms a portion of a parallel processing circuit provided on the second peripheral area 704b. A MOS transistor 709 forms a circuit other than the parallel processing circuit provided on the second peripheral area 704b.

A second conductive pattern 710 forms a DC voltage supply wiring for supplying a DC voltage to the MOS transistor 709 forming a parallel processing circuit. The second conductive pattern 710 extends in the depth direction of paper to supply a DC voltage commonly to MOS transistors of each parallel processing circuit. The second conductive pattern 710 is provided on a portion other than the pixel area 703b.

A first conductive pattern 711 is provided on the first substrate 701. The first conductive pattern 711 is provided on a portion other than the pixel area 703a.

A first electrical connection unit 712 electrically connects the second conductive pattern 710 with the first conductive pattern 711. For example, the first electrical connection unit 712 can be formed by forming conductive patterns by using an uppermost wiring layer on the first substrate 701 and an uppermost wiring layer on the second substrate 702 and then electrically connecting these conductive patterns. Alternatively, the first electrical connection unit 712 may also be formed by forming the first conductive pattern 711 and/or the second conductive pattern 710 by using respective uppermost wiring layers and then electrically connecting these conductive patterns.

The first conductive pattern 711 is provided in the first peripheral area 704a on the first substrate 701. The first peripheral area 704a includes less number of circuit elements than the second peripheral area 704b on the second substrate 702 does. Alternatively, the first peripheral area 704a includes no circuit element. Therefore, the first substrate 701 has a relatively high degree of freedom of wiring layout. Accordingly, it is preferable to make the area of the first conductive pattern 711 larger than the area of the second conductive pattern 710 to enable reducing of the resistance while maintaining the degree of freedom of wiring layout of the second substrate 702.

A second electrical connection unit 713 electrically connects the FD 706 with the gate of the amplifier transistor 707. The second electrical connection unit 713 can be formed by forming conductive patterns by using the uppermost wiring layer on the first substrate 701 and the uppermost wiring layer on the second substrate 702 and then electrically connecting these conductive patterns. Referring to a relation between the area of the conductive patterns forming the first electrical connection unit 712 and the area of the conductive patterns forming the second electrical connection unit 713, it is preferable to make the area of the conductive patterns forming the second electrical connection unit 713 smaller than the area of the conductive patterns forming the first electrical connection unit 712. The second electrical connection unit 713 connects the FD 706 with the gate of the amplifier transistor 707 since a larger area of conductive patterns produces a larger parasitic capacitance in the FD 706.

Figure 8A:
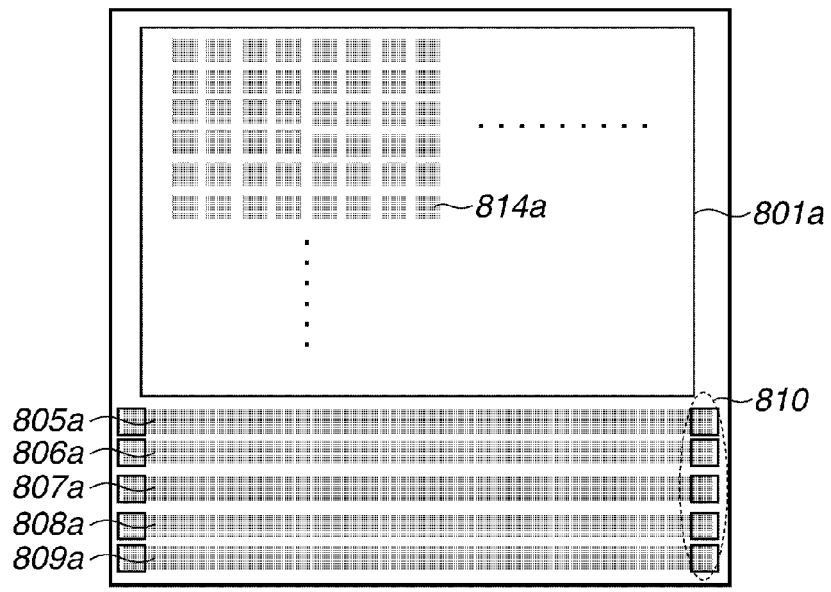
FIG. 8A is an exemplary top view illustrating the solid-state imaging device.
Figure 8B:
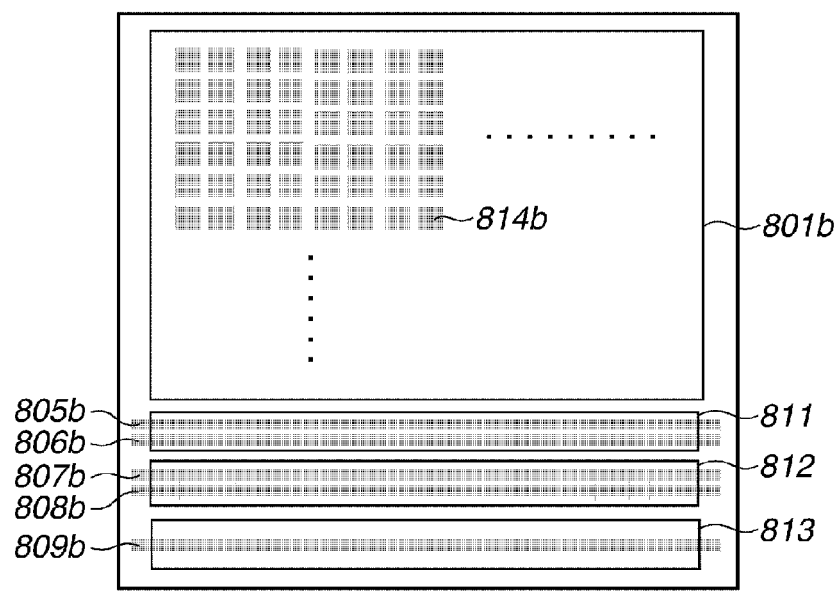
FIG. 8B is an exemplary top view illustrating the solid-state imaging device.

FIGS. 8A and 8B are top views schematically illustrating the solid-state imaging device according to the present invention. FIG. 8A illustrates the first substrate 701, and FIG. 8B illustrates the second substrate 702. For convenience of explanations, FIGS. 8A and 8B illustrate the first and second conductive patterns illustrated in FIG. 7, respectively, and conductive patterns at connection units of pixel portions formed in the same wiring layer as the first and second conductive patterns. Other conductive patterns are omitted.

Pixel areas 801a and 801b are provided on the first and second substrates, respectively. A plurality of first conductive patterns 805a to 809a is provided on the first substrate 701. A plurality of second conductive patterns 805b to 809b is provided on the second substrate 702. The second conductive patterns 805b to 809b are provided to supply a DC voltage to respective parallel processing circuits. The first conductive patterns 805a, 806a, 807a, and 808a are electrically connected with the second conductive patterns 805b, 806b, 807b, and 808b, respectively, via electrical connection units (described below). When comparing areas of the first and second conductive patterns electrically connected with each other, the area of the first conductive patterns is made larger than the area of the second conductive patterns. This circuit architecture largely reduces the resistance of the DC voltage supply line, making it possible to improve the degree of freedom of other wiring layout of circuit elements provided on the second substrate 702.

Input pads 810 are provided on the first substrate 701. A DC voltage is supplied from the external of the substrate 701 to the input pads 810. A DC voltage is supplied to similar input pads provided on the other end of the substrate 701. Parallel processing circuits 811 to 813 are provided on the second substrate 702. For example, the parallel processing circuits 811 to 813 correspond to the first parallel processing circuit 304, the second parallel processing circuit 307, and the third parallel processing circuit 310, respectively.

Conductive patterns 814a and 814b provided on the pixel areas 801a and 801b, respectively, form electrical connection units.

Figure 9A:
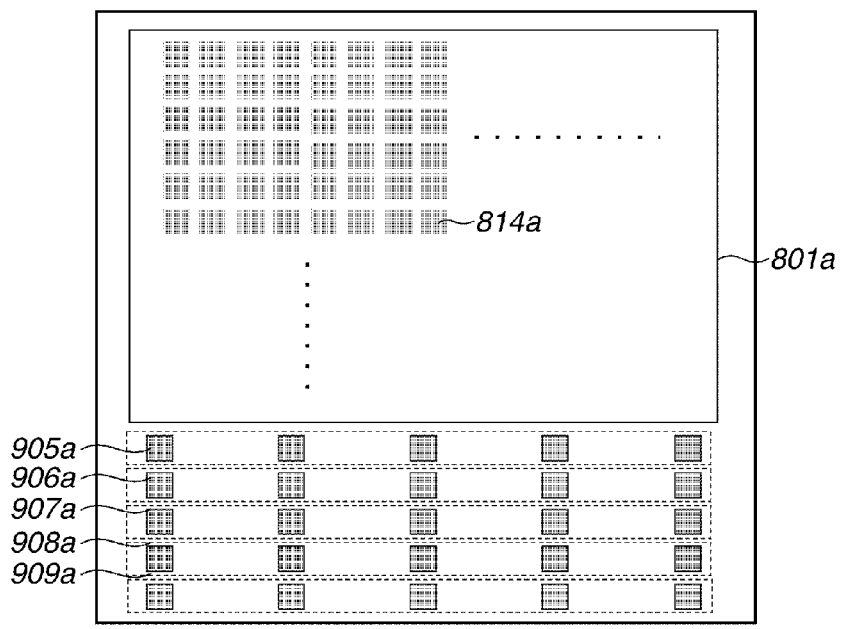
FIG. 9A is another exemplary top view illustrating the solid-state imaging device.
Figure 9B:
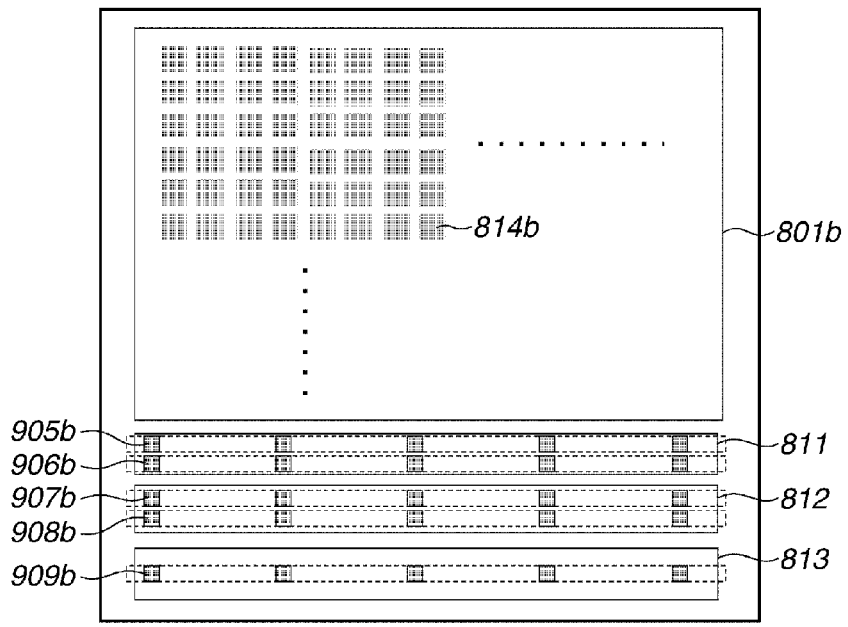
FIG. 9B is another exemplary top view illustrating the solid-state imaging device.

FIGS. 9A and 9B are top views schematically illustrating the solid-state imaging device according to the present invention, which are different from top views in FIGS. 8A and 8B. FIG. 9A illustrates the first substrate 701, and FIG. 9B illustrates the second substrate 702. For convenience of explanations, FIGS. 9A and 9B illustrate conductive patterns provided in a wiring layer higher than the first and second conductive patterns illustrated in FIG. 7. These conductive patterns make electrical connections directly with respective substrates. Other conductive patterns are omitted. Elements having the same function as those in FIGS. 8A and 8B are assigned the same reference numerals, and therefore duplicated descriptions will be omitted.

Conductive patterns 905a and 905b electrically connect the first conductive pattern 805a with the second conductive pattern 805*b*. Conductive patterns 906*a* and 906*b* electrically connect the first conductive pattern 806*a* with the second conductive pattern 806*b*. Conductive patterns 907*a* and 907*b* electrically connect the first conductive pattern 807*a* with the second conductive pattern 807*b*. Conductive patterns 908*a* and 908*b* electrically connect the first conductive pattern 808*a* with the second conductive pattern 808*b*.

Referring to FIG. 9B, the areas of conductive patterns forming electrical connection units are differentiated. Specifically, the area of the conductive patterns provided on the first substrate 701 is made larger than the area of the conductive patterns provided on the second substrate 702. This circuit architecture ensures electrical connections between the first and second conductive patterns.

While the present invention has specifically been described based on the above-mentioned exemplary embodiments, the present invention is not limited thereto but can be modified and combined as required without departing from the concepts thereof.

For example, with the cross-sectional structure illustrated in FIG. 7, one principal plane of the first substrate 701 (having devices formed thereon) and one principal plane of the second substrate 702 (having devices formed thereon) are facing each other and then stuck together. However, one principal plane of the first substrate 701 (having devices formed thereon) and the rear surface of the second substrate 702 may also be stuck together.

Although three different exemplary parallel processing circuits have specifically been described, the parallel processing circuits are not limited thereto. For example, the present invention can be applied also to a case where parallel processing circuits parallelly performing A/D conversion are provided. Since an alias is likely to occur particularly when parallel processing circuits handle analog signals, high effects can be obtained by applying the present invention to parallel processing circuits for processing analog signals.

Further, although the present invention has specifically been described based mainly on a case of application to a ground wiring, it is obvious that the present invention can be applied to a wiring for supplying a DC power voltage or an intermediate voltage between the ground potential and the power voltage.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-149477 filed Jun. 30, 2010, which is hereby incorporated by reference herein in its entirety.

The invention claimed is:

1. A solid-state imaging device comprising:
a plurality of photoelectric conversion units; and
a plurality of circuits configured to operate in parallel for outputting signals based on an electric charge generated in a predetermined number of the photoelectric conversion units,
wherein a first substrate where the plurality of photoelectric conversion units are provided and a second substrate where a plurality of transistors that forms the plurality of circuits are provided are electrically connected with each other, and
wherein the plurality of circuits are supplied with a DC voltage from one wiring in common, and the one wiring is formed by a first conductive pattern provided on the first substrate and a second conductive pattern provided on the second substrate.

2. The solid-state imaging device according to claim 1, wherein the first conductive pattern overlaps with the plurality of circuits.

3. The solid-state imaging device according to claim 1, comprising:
a floating diffusion;
a transfer unit configured to transfer a signal from each of the photoelectric conversion units to the floating diffusion; and
a pixel amplifier of which the gate is electrically connected with each other; and
wherein the floating diffusion and the transfer unit are provided on the first substrate.

4. The solid-state imaging device according to claim 3, wherein the pixel amplifier is provided in the second substrate.

5. The solid-state imaging device according to claim 4, further comprising a reset unit configured to reset a potential of an input node of the pixel amplifier, and the reset unit is provided in the second substrate.

6. The solid-state imaging device according to claim 1, further comprising a plurality of pixel amplifiers each amplifying signals based on an electric charge generated in a corresponding photoelectric conversion unit.

7. The solid-state imaging device according to claim 6, wherein each of the circuits is a current source circuit configured to supply a bias current to the pixel amplifier.

8. The solid-state imaging device according to claim 6, wherein each of the circuits is a column amplifier configured to amplify a signal output from the pixel amplifier.

9. The solid-state imaging device according claim 1, wherein each of the circuits is a signal holding unit configured to retain a signal.

10. The solid-state imaging device according to claim 1, wherein an area of the first conductive pattern is larger than an area of the second conductive pattern.

11. The solid-state imaging device according to claim 1, wherein the first conductive pattern and the second conductive pattern are electrically connected with each other via conductive patterns other than from the first and second conductive patterns.

12. The solid-state imaging device according to claim 1, wherein each of the circuits is an A/D conversion circuit.

13. The solid-state imaging device according to claim 1, wherein each of the circuits processes a signal based on the electric charge.

14. The solid-state imaging device according to claim 1, wherein
one set of pixels out of the plurality of pixels is electrically connected to one line in common,
another set of pixels out of the plurality of pixels is electrically connected to another line in common, and
one circuit of the circuits processes a signal on the one line, and another circuit of the circuits processes a signal on the another line.

15. The solid-state imaging device according to claim 1, wherein the one wiring does not supply a circuit in the first substrate with a DC voltage.

16. The solid-state imaging device according to claim 15, wherein the first conductive pattern overlaps with the plurality of circuits.

17. The solid-state imaging device according to claim 1, wherein the first conductive pattern and the second conductive pattern are disposed between the first substrate and the second substrate, and a distance between the first conductive pattern and the first substrate is less than a distance between the first conductive pattern and the second substrate.

18. A solid-state imaging device comprising:

a plurality of photoelectric conversion units; and a plurality of circuits configured to operate in parallel for outputting signals based on an electric charge generated in a predetermined number of the photoelectric conversion units, wherein a first substrate where the plurality of photoelectric conversion units and a transistor are provided and a second substrate where a plurality of transistors that forms the plurality of circuits are provided are electrically connected with each other, and wherein the plurality of circuits are supplied with a DC voltage from one wiring in common, and the one wiring is formed by a first conductive pattern and a second conductive pattern, the first conductive pattern being positioned further from the second substrate than a position of the second conductive pattern, and wherein the first conductive pattern and the second conductive pattern are disposed between the first substrate and the second substrate, and a distance between the first conductive pattern and the first substrate is less than a distance between the first conductive pattern and the second substrate.

19. The solid-state imaging device according to claim 18, wherein an area of the first conductive pattern is larger than an area of the second conductive patterns.

20. The solid-state imaging device according to claim 18, wherein the first conductive pattern and the second conductive pattern are electrically connected with each other via conductive patterns other than the first and second conductive patterns, and the one wiring does not supply a circuit in the first substrate with a DC voltage.

* * * * *